United States Patent [19]

Saitoh

[11] Patent Number: 6,049,126
[45] Date of Patent: *Apr. 11, 2000

[54] SEMICONDUCTOR PACKAGE AND AMPLIFIER EMPLOYING THE SAME

[75] Inventor: Yoshiharu Saitoh, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/764,241

[22] Filed: Dec. 16, 1996

[30] Foreign Application Priority Data

Dec. 14, 1995 [JP] Japan ................................ 7-325326

[51] Int. Cl.[7] ........................... H01L 23/34; H01L 23/053; H01L 23/48
[52] U.S. Cl. ........................... 257/728; 257/701; 257/692; 333/247
[58] Field of Search .................................. 257/692, 723, 257/728, 701; 333/247

[56] References Cited

U.S. PATENT DOCUMENTS

| | | |
|---|---|---|
| 3,740,672 | 6/1973 | Presser . |
| 3,949,316 | 4/1976 | Tsurushima . |
| 4,042,952 | 8/1977 | Kraybill ................................ 257/728 |
| 4,427,991 | 1/1984 | Yamamura et al. . |
| 4,551,746 | 11/1985 | Gilbert et al. ........................... 257/691 |
| 4,672,151 | 6/1987 | Yamamura . |
| 5,291,042 | 3/1994 | Shiga . |
| 5,294,897 | 3/1994 | Notani et al. ............................... 333/33 |
| 5,424,579 | 6/1995 | Arai et al. ................................ 257/690 |
| 5,631,809 | 5/1997 | Takagi et al. ............................ 361/820 |

FOREIGN PATENT DOCUMENTS

| | | | |
|---|---|---|---|
| 396152 | 11/1990 | European Pat. Off. ................ | 257/728 |
| 57-91542 | 6/1982 | Japan ..................................... | 257/728 |
| 2112242 | 4/1990 | Japan ..................................... | 257/728 |
| 4-312960 | 11/1992 | Japan ..................................... | 257/728 |

OTHER PUBLICATIONS

T. Watanabe et al.; "Multichip IC for Cellular Handheld Telephones"; NEC Technical Journal, vol. 44, Nov. 1991, pp. 216–219.

Y. Yamashita et al.; GaAs Power Amplifier Module for Protable Telephones; National Technical Report, vol. 36, No. 4, Aug. 1990, pp. 34–38.

Panasonic News on Technical Information, No. 75, pp. 14–16.

*Primary Examiner*—Teresa M. Arroyo
*Attorney, Agent, or Firm*—McGinn & Gibbs, P.C.

[57] ABSTRACT

A semiconductor module, includes a circuit including a plurality of semiconductor devices connected together as a package, wherein the plurality of semiconductor devices have a same device structure. Further, an amplifier includes a cascade-connection of a plurality of semiconductor device packages, wherein the plurality of semiconductor devices have a same device structure. Preferably, the devices include field-effect transistors (FETs), and an external input lead of a semiconductor package is connected to an input stage of the amplifier, an interstage circuit is connected between an intermediate output lead and an intermediate input lead, and an external output lead is connected to an output stage of the amplifier.

9 Claims, 9 Drawing Sheets

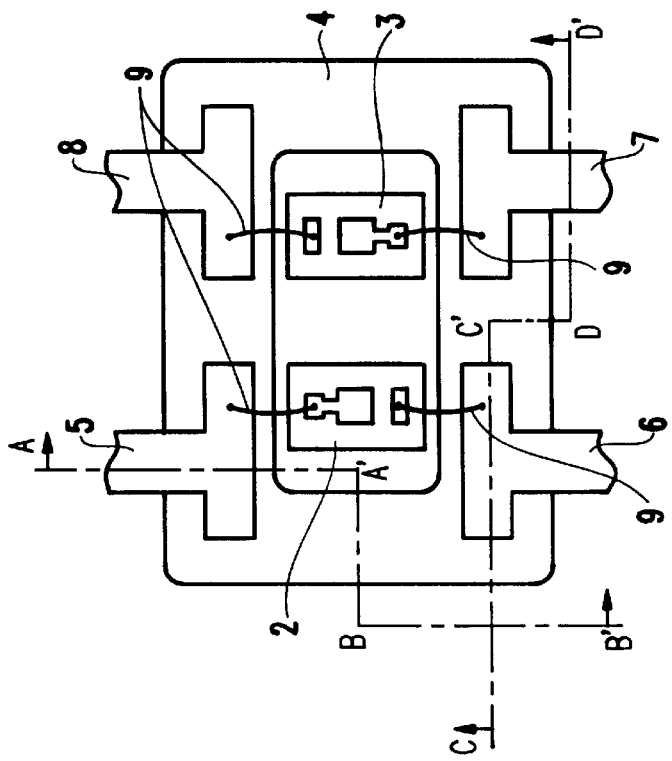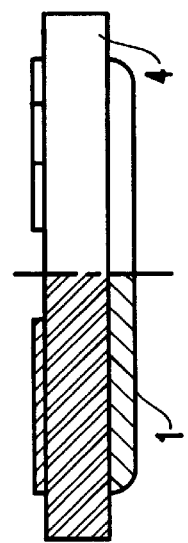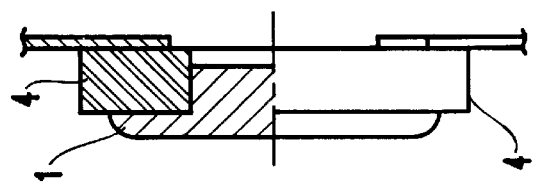

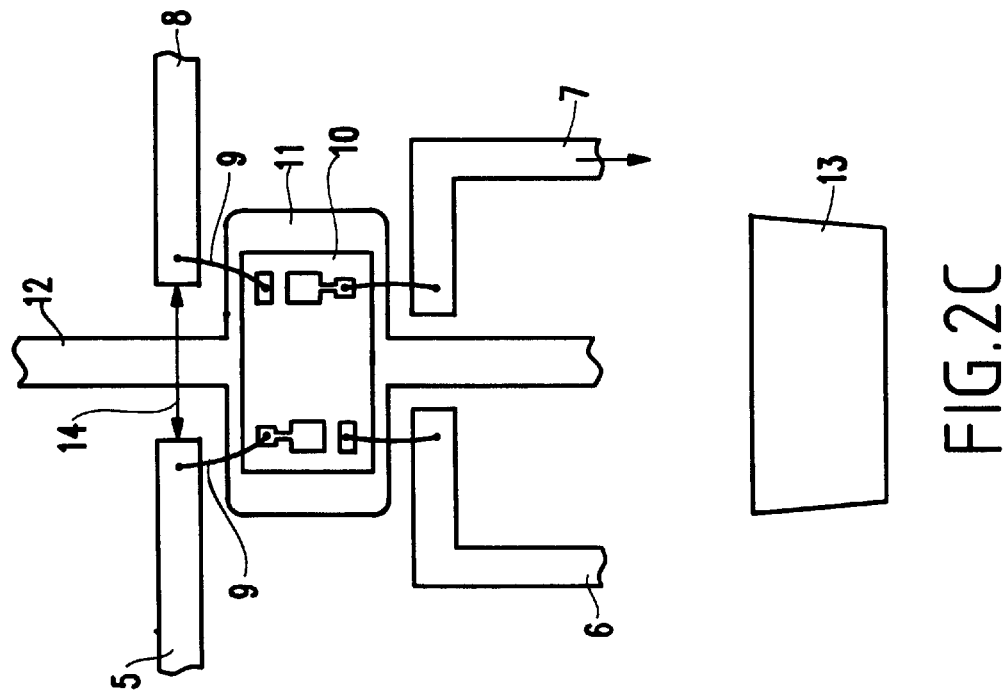
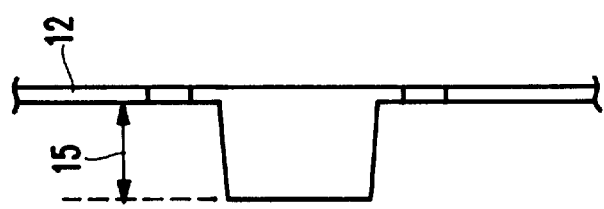

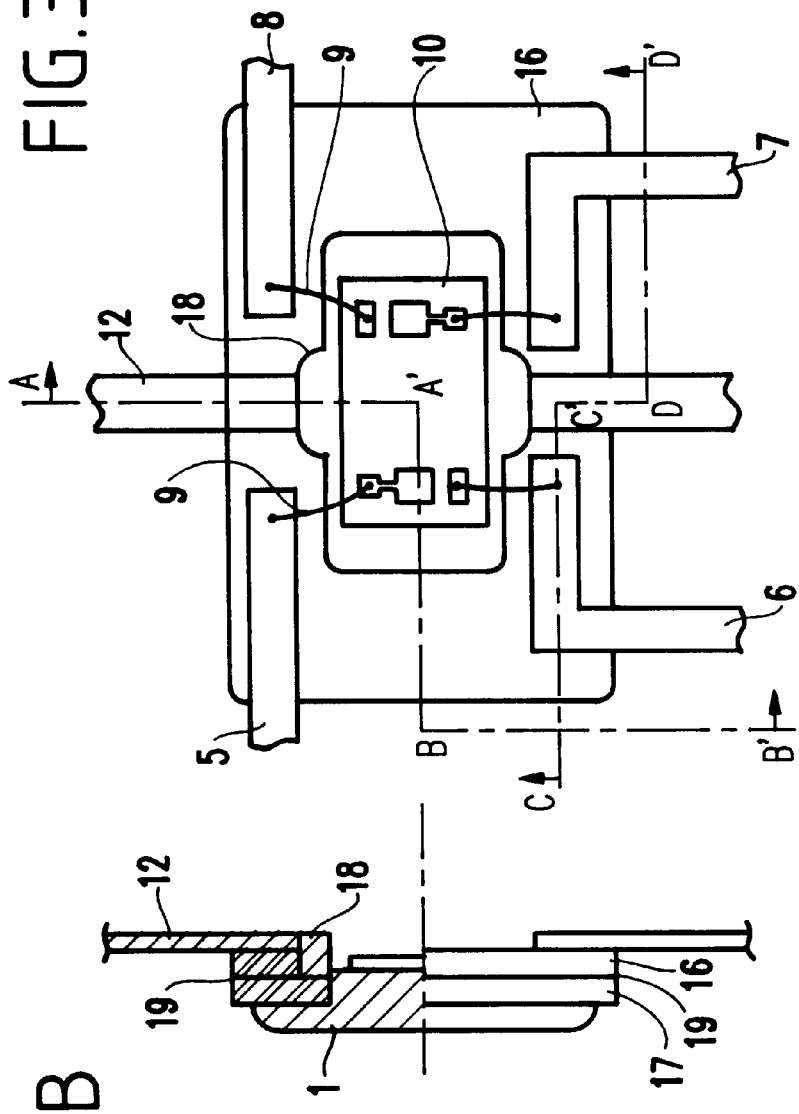
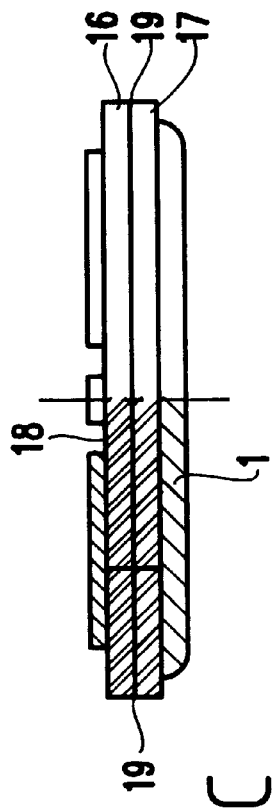
FIG.3A
FIG.3B
FIG.3C

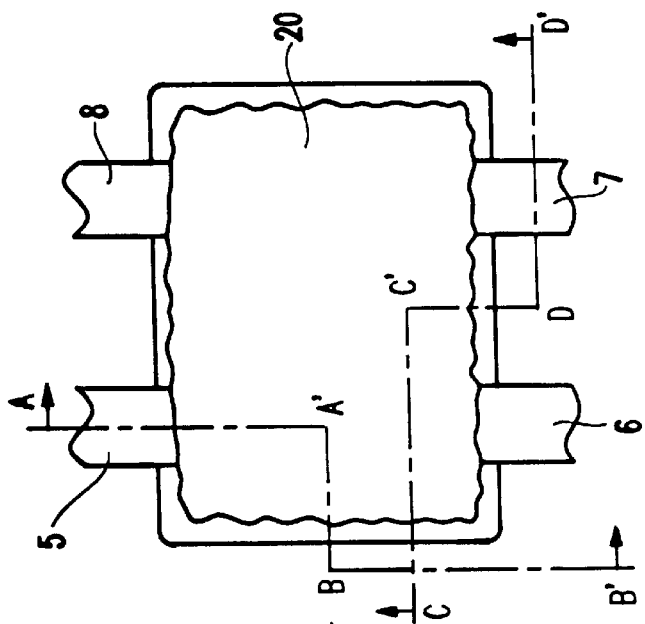
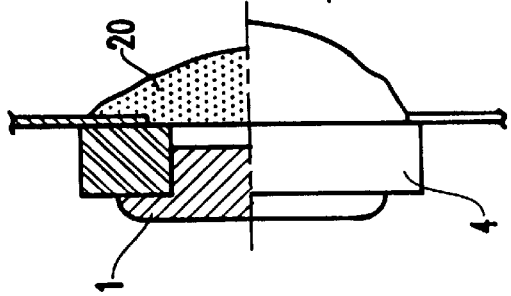
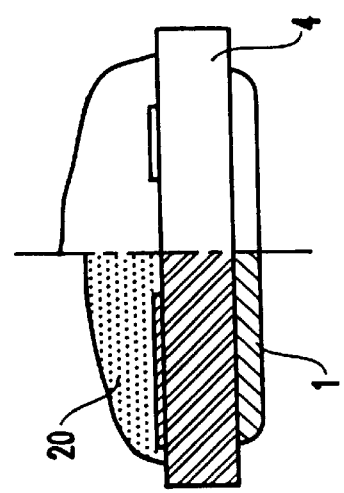
FIG.6A
FIG.6B
FIG.6C

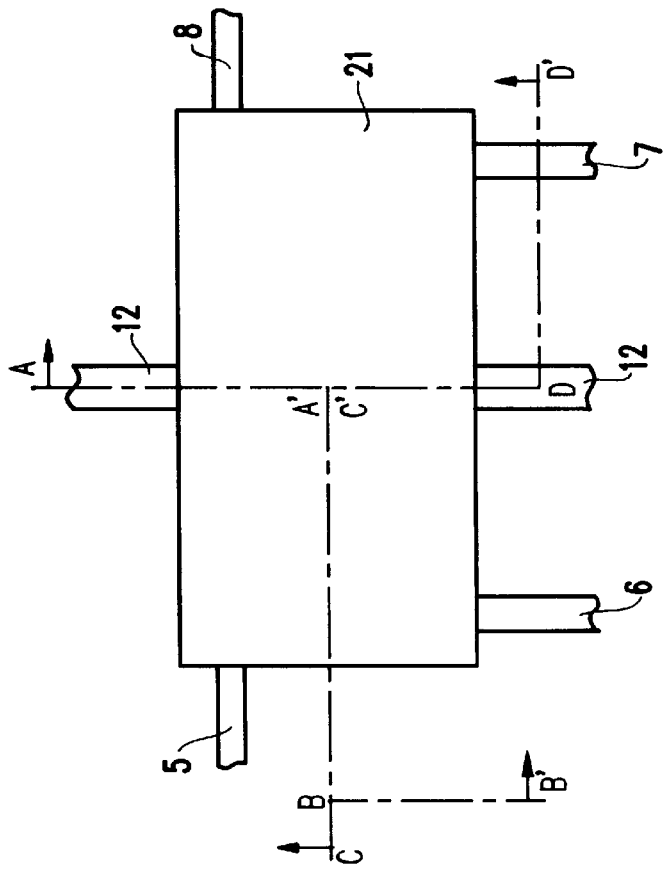

SEMICONDUCTOR PACKAGE AND AMPLIFIER EMPLOYING THE SAME

BACKGROUND OF THE INVENTION

The present invention generally relates to a semiconductor package and an amplifier employing the semiconductor package, and more particularly to a high-frequency-oriented semiconductor package for holding a semiconductor chip for processing high-frequency signals and an amplifier employing the semiconductor package.

DESCRIPTION OF THE RELATED ART

Conventional microwave-oriented, high-output amplifiers employ GaAs field-effect transistors (FETs). Generally, gallium arsenide is an important device material, having a large band gap (1.47 eV) at room temperature and high mobility (0.85 m$^2$/V·s). High-output GaAs FETs are used in a variety of radio apparatuses, including relays for communications satellites (e.g., mobile or stationary), and are often used in the transmitter of cellular phones for the higher efficiencies of high-output GaAs FETs as compared to Si bipolar transistors.

According to NEC Technical Journal, Vol. 144 (Nov. 1991), high-output amplifiers used in the transmitting stages of cellular phones are composed of GaAs FETs in a one-stage or two-stage cascaded-connection. The amplifiers are constructed as modules comprising the FETs mounted on thick-film substrates together with chip parts. A chip having the GaAs FETs forming the two-stage cascade-connection is typically held and sealed, to ensure reliability and facilitate mounting.

As a result, for construction of a two-stage cascade connection, one module has two separate FET packages on board (National Technical Report, Vol. 36, No. 4, Aug. 1990, pp. 34–38, Panasonic News on Technical Information, No. 75, pp. 14–16). Since a cascade-connection is easy to form, such a high-frequency-oriented package with such a configuration as illustrated in FIG. 10 has been developed.

According to the conventional device shown in FIG. 10, a GaAs FET chip 2 is mounted on a radiating copper base 1, a ceramic plate (Al$_2$O$_3$) 4 with a hollowed-out center portion is provided, and I/O leads 5 and 8 are brazed onto the ceramic plate 4. After being wire-bonded, the FET 2 is hermetically sealed with an epoxy resin, and is ready for use.

With the conventional semiconductor packages, in order to modularize a circuit comprising amplifiers configured in a two-or-more-stage connection, a plurality of semiconductor packages must be mounted on one module. This has made down-sizing the module difficult since a plurality of packages must be provided. For purposes of the present application, a "package" is defined as a unit having at least one type of device but which does not consist of a circuit. A "module" is defined as a hybrid integrated circuit typically holding at least one package.

Additionally, using a plurality of separate packages increases the manufacturing cost, and thus lowering the product cost is difficult.

Another problem is that mounting semiconductor devices having different device structures and different transistor characteristics in one package causes vibration, "noise", etc. due to their close proximity and their mutual interference. Hence, hitherto the invention, these devices have not been packaged as a single unit.

SUMMARY OF THE INVENTION

In view of the foregoing problems of the conventional devices, it is an object of the present invention to provide a modularized circuit comprising amplifiers configured in a two-or-more-stage connection.

Another object is to arrange a plurality of semiconductor packages as a single module.

Yet another object is to down-size the module and to decrease the manufacturing cost thereof.

In a first aspect, a semiconductor module, includes a circuit including a plurality of semiconductor devices connected together as a package, wherein the plurality of semiconductor devices have a same device structure.

In a second aspect of the invention, a semiconductor package, is provided which includes a plurality of semiconductor devices connected together, the plurality of semiconductor devices each having a same device structure; a first input lead coupled to a first device of the plurality of devices; and a first output lead coupled to a second device of the plurality of devices, the first input lead and the first output lead each having first and second sides having respective first and second lengths, the first length being shorter than the second length, wherein the first side of the first input lead is one of opposed and skewed from the first side of the first output lead, and is separated therefrom by a predetermined distance.

In a third aspect of the invention, an amplifier includes a cascade-connection of a plurality of semiconductor device packages, wherein the plurality of semiconductor devices have a same device structure. Preferably, an external input lead of a semiconductor package is connected to an input stage of the amplifier, an interstage circuit is connected between an intermediate output lead and an intermediate input lead, and an external output lead is connected to an output stage of the amplifier.

Preferably, only multistage transistors are packaged as a unit, and are incorporated onto a circuit substrate with a resistor and a capacitor connected thereto, to fabricate a module. Preferably, the semiconductor devices according to the present invention include GaAs FETs, and the plurality of semiconductor devices are preferably mounted on a same metal base.

The semiconductor package also preferably includes a first input lead and a first output lead for a first semiconductor device, and a second input lead and a second output lead for a second semiconductor device. The first input lead and the second output lead are placed at the side of a first side face of the semiconductor package, and the first output lead and the second input lead are placed at the side of a second side face of the semiconductor package which is opposite the first side face.

Preferably, the first input lead and the second output lead are placed parallel to the first side face. Additionally, ground leads are preferably connected to a metal base and provided between the first input lead and the second output lead, and between the first output lead and the second input lead, respectively.

Additionally, an insulator may be provided along the perimeters of the plurality of semiconductor devices on the metal base. The first input lead, the first output lead, the second input lead, the second output lead and the ground lead are preferably provided on the insulator, and the first input lead and the first output lead are connected to the first semiconductor device with bonding wires.

Further, the second input lead and the second output lead are connected to the second semiconductor device with bonding wires, the inside wall of the insulator are provided with a "castellation" plated with a metal, and the ground lead and the metal base are connected together via the metal plating.

Additionally, a first insulator is provided preferably along the perimeters of a plurality of semiconductor devices on the metal base, a metal layer is provided on the first insulator, a second insulator is provided on the metal layer, and the first input lead, the first output lead, the second input lead and the second output lead are provided on the second insulator. The first input lead and the first output lead are preferably connected to the first semiconductor device with bonding wires, the second input lead and the second output lead are connected to the second semiconductor device with bonding wires, and the metal layer is connected to the metal base.

Moreover, the semiconductor package formed as an amplifier is preferably provided with an external input lead, an external output lead, an intermediate input lead and an intermediate output lead. A first electrode of the first semiconductor device is connected to the external input lead, a second electrode of the first semiconductor device is connected to the intermediate input lead, a first electrode of the second semiconductor device is connected to the external output lead, and a second electrode of the second semiconductor device is connected to the external output lead. The external input lead is preferably connected to the input stage of the amplifier outside the semiconductor package, the intermediate output lead and the intermediate input lead are connected together via an interstage circuit, and the external output lead is connected to the output stage of the amplifier.

Additionally, the input stage, interstage circuit and the output stage are preferably provided on a module substrate, and the semiconductor package is mounted on the module substrate.

Further, a third electrode of the first semiconductor device and a third electrode of the second semiconductor device preferably are commonly grounded, and the first and second electrodes of the first and second semiconductor devices are preferably electrically isolated from one another (e.g., not electrically connected together) in the semiconductor package.

With the unique and unobvious structure of the invention, miniaturized and low-cost, high-frequency-oriented semiconductor packages and amplifiers employing them are formed.

BRIEF DESCRIPTION OF THE DRAWINGS

The foregoing and other objects, aspects and advantages will be better understood from the following detailed description of a preferred embodiment of the invention with reference to the drawings, in which:

FIGS. 1(A)–1(C) illustrate a structure of a semiconductor package according to a first embodiment of the present invention, wherein FIG. 1(A) is a plan view of the semiconductor package, FIG. 1(B) is a cross-sectional view of the semiconductor package taken along lines A–A' of FIG. 1(A) and a side view taken along lines B–B' of FIG. 1(A), and FIG. 1(C) is a cross-sectional view taken along lines C–C' and a side view taken along lines D–D' of FIG. 1(A);

FIGS. 2(A)–2(C) illustrate a structure of a semiconductor package according to a second embodiment of the present invention, wherein FIG. 2(A) is a plan view of the semiconductor package, and FIGS. 2(B) and 2(C) are cross-sectional views of a heat-sink section;

FIGS. 3(A)–3(C) illustrate a structure of a semiconductor package according to a third embodiment of the present invention, wherein FIG. 3(A) is a plan view of the semiconductor package, FIG. 3(B) is a cross-sectional view of the semiconductor package taken along lines A–A' in FIG. 3(A) and a side view taken along lines B–B' of FIG. 3(A), and FIG. 3(C) is a cross-sectional view taken along lines C–C' and a side view taken along lines D–D' of FIG. 3(A);

FIGS. 6(A)–6(C) are views illustrating the semiconductor device of FIGS. 1(A)–1(C), respectively, after resin molding;

FIGS. 7(A)–7(C) are views illustrating the semiconductor device of FIGS. 2(A)–2(C), respectively, after resin molding;

DETAILED DESCRIPTION OF PREFERRED EMBODIMENTS OF THE INVENTION

Figure 4:
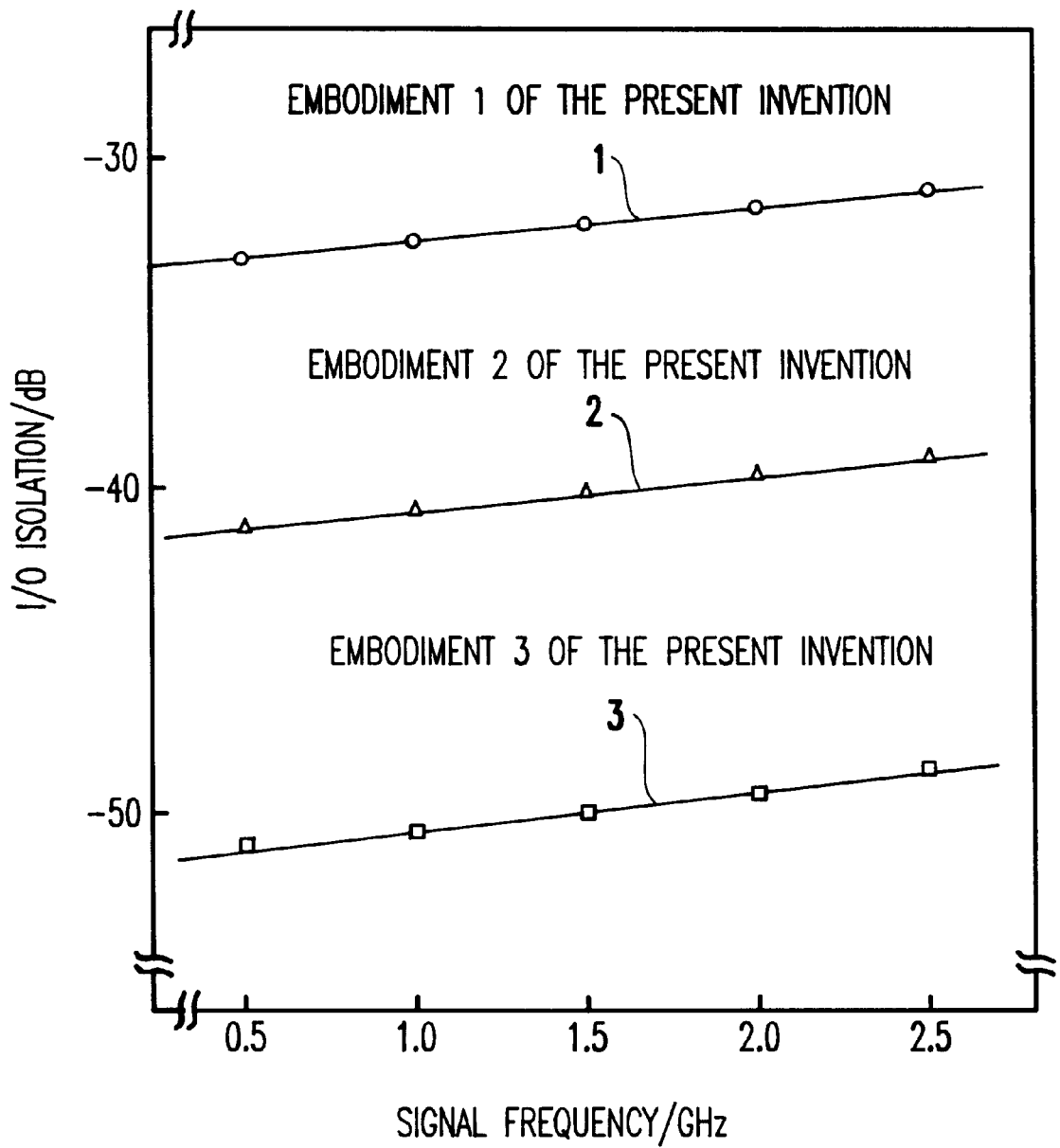
FIG. 4 is a graph exhibiting the frequency characteristics of the input/output (I/O) isolation according to the first, second and third embodiments of the present invention.

Referring now to the drawings, and more particularly to FIGS. 1(A)–1(C), a first embodiment according to the present invention is shown in which GaAs field-effect transistors (FET) chips 2 and 3 are mounted on a heat-radiating base 1, a ceramic substrate 4 with a hollowed-out center portion is provided, and I/O leads 5, 6, 7 and 8 are brazed onto the ceramic substrate 4.

Preferably, the base 1 is formed of copper or other conducting metal having a thickness of 0.4 mm, the ceramic substrate 4 is formed of $Al_2O_3$ or the like, and the leads 5–8 are formed of copper or another suitable conducting metal. Further, the leads preferably have a T-shape, and have a thickness within a range of 0.1–0.2 mm. Preferably, the forward edges of the leads 5–8 are formed to be within a range of 0.1–0.3 mm from a periphery (e.g., edge) of the hollowed-out center portion of the substrate 4. Additionally, leads 5 and 8 are separated from one another within a range of 1.5–2.0 mm, and leads 6 and 7 are similarly separated from one another.

When two high-output GaAs FET chips 2 and 3 are held in a high-frequency-oriented package to form a two-stage-cascaded amplifier, as in FIGS. 1(A)–1(C), bonding wires 9 are used for establishing connections between the gate terminal of the first-stage GaAs FET 2 and an external input lead 5, between the drain terminal of the first-stage GaAs FET 2 and an intermediate output lead 6, between the gate terminal of the final-stage GaAs FET 3 and an intermediate input lead 7, and between the drain terminal of the final-stage FET 3 and an external output lead 8, respectively.

Preferably, bonding wires 9 are formed of gold, and respective ends of the bonding wires are connected to the GaAs FET 2 and the external input lead 5 by gold.

Source terminals of the first-stage GaAs FET 2 and the final-stage GaAs FET 3 are connected to the copper base 1 and grounded via metallized portions (not illustrated in FIG. 1(A)) on the sides and metallized portions on the undersides of the respective chips. Preferably, the metallized portions are formed of gold, and have a thickness of 0.05 mm.

The intermediate output lead 6 and the intermediate input lead 7 are positioned parallel to each other along the same side (e.g., the bottom side in the plan view of FIG. 1(A)) of the high-frequency-oriented package, for a particular reason.

Figure 5:
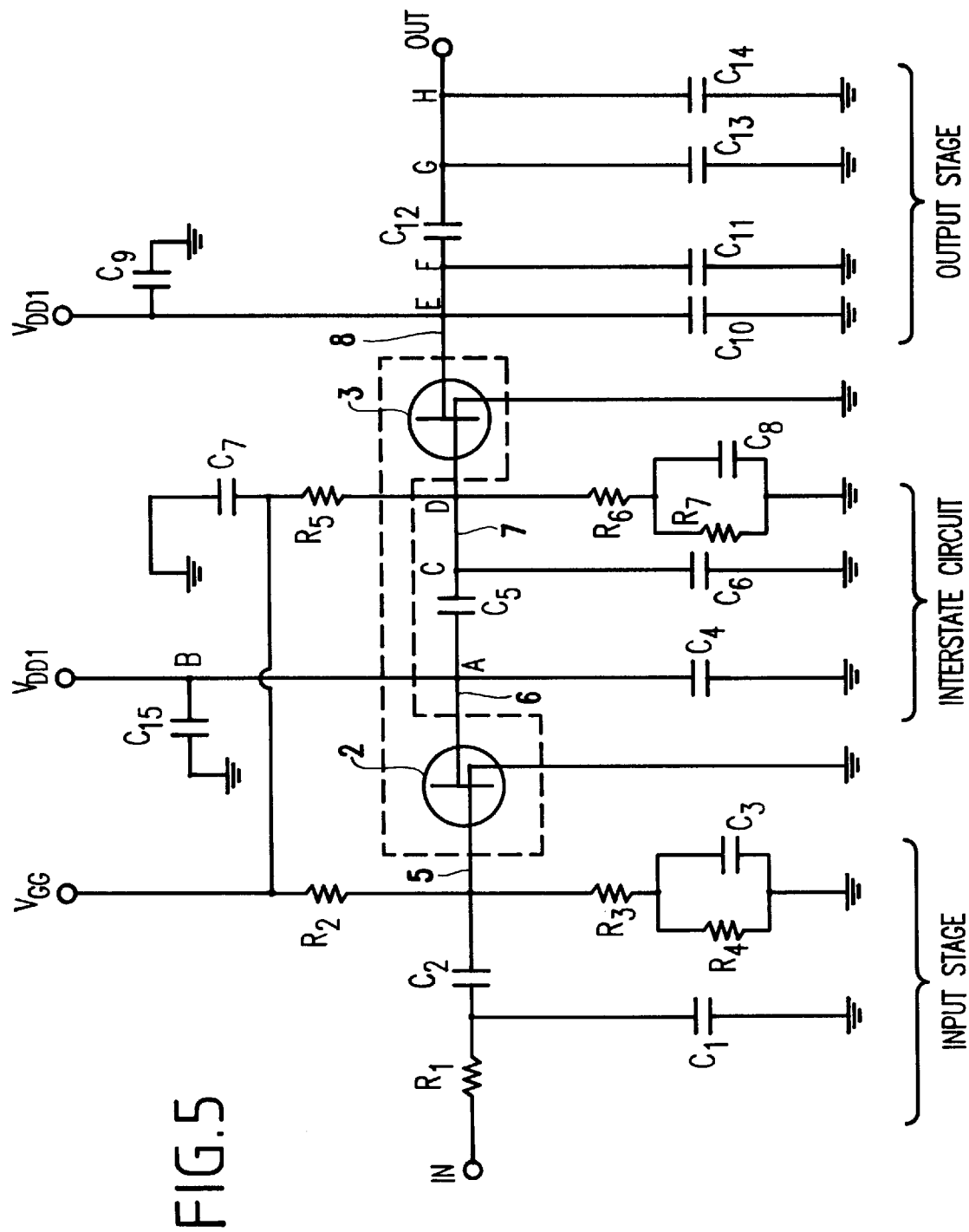
FIG. 5 is a circuit diagram of a high-output amplifier according to the present invention, for use, for example, in the transmitting stage of a cellular phone.

Specifically, with a two-stage, cascaded-type of high-output amplifier module for use in the transmitting stage (e.g., transmitter) of a cellular phone, an impedance-matching circuit is formed for input and output from each of the two GaAs FETs 2, 3, as illustrated in an equivalent circuit schematic of FIG. 5. FIG. 5 is a circuit diagram illustrating a first embodiment of the amplifier according to the present invention.

The impedance-matching circuit is located between the drain (e.g., intermediate output) of the first-stage FET 2 and the gate (e.g., intermediate input) of the final-stage FET 3, and is termed an "interstage circuit", as shown in FIG. 5. The first-stage Ga-As FET 2 and the final-stage GaAs FET 3 are shown in the broken lines of FIG. 5. The second and third stage FETs are parallel-connected. The first-stage FET may include one (1) FET device, whereas the third-stage FET 3 may include a plurality of FET devices (e.g., six parallel-connected FETs). However, preferably the second amplifier (third stage FET structure 3) includes a smaller number of FETs. All of FETs 2, 3 have the same structure.

FIG. 1(B) illustrates a cross-sectional view of the semiconductor package taken along lines A–A' of FIG. 1(A) and a side view taken along lines B–B' of FIG. 1(A), and FIG. 1(C) illustrates a cross-sectional view taken along lines C–C' and a side view taken along lines D–D' of FIG. 1(A).

High density and miniaturization of such a high-output amplifier module in its entirety is most efficiently accomplished by placing the intermediate output lead 6 (e.g., shown in FIG. 1(A)) and the intermediate input lead 7 along the same side, parallel to each other, as illustrated in FIG. 1(A).

Additionally, since lead frames for packages are easier to fabricate, and thus the productivity increases when the leads are arranged both bivertically and bilaterally, the external input lead 5 and the external output lead 8 are also placed parallel to each other along the same side (e.g., the side opposite the side along which the intermediate output lead 6 and the intermediate input lead 7 are placed).

In the equivalent circuit shown in FIG. 5 and described below, resistors R1–R7 and capacitors C1–C15 are provided. The resistors R1–R7 are provided preferably which have values, for example, of about 5.1 Ω, 1000 Ω, 510 Ω, 150 Ω, 1000 Ω, 510 Ω, and 150 Ω, respectively, whereas the capacitors C1–C14 have values of 6 pF, 15 pF, 1000 pF, 2 pF, 8 pF, 15 pF, 1000 pF, 1000 pF, 56 pF, 1 pF, 1 pF, 12 pF, 4 pF, and 4 pF, respectively. C15 also has a suitable value in view of the above construction.

As shown in FIG. 5, an input terminal IN is connected to a resistor R1, and R1 is connected to first ends of capacitors C1 and C2, with a second end of C1 grounded. A second end of C2 is connected with the external input lead 5 of the first-stage GaAs FET 2, R2 and R3, and R3 is connected to R4 and C3. R3 and C3 are grounded in parallel.

The other end of R2 is connected to C7 grounded at one end, R5 with one end connected to contact D, and $V_{GG}$. For purposes of this application, $V_{GG}$ represents the voltage supplied to the gate terminals of the GaAs FETs 2 and 3, and may have operational values within a range of −2.0 to −4.0 V, and typically −2.5V.

The source terminal of the first-stage GaAs FET 2 is grounded, and the intermediate output lead 6 is connected to a first end of C5 via a contact A.

C4 has a first end grounded, and a second end of C4 and contact B are connected to the intermediate output lead 6 at point A. C15 has a first end grounded and a second end of C15, along with $V_{DD1}$, are connected to contact B. For purposes of this application, $V_{DD1}$ represents the voltage supplied to the gate terminal of the GaAs FET 2, and may have operational values within a range of 2.5 to 8.0 V, and typically 3.4V.

A second end of C5 is connected to the intermediate input lead 7 of a final-stage GaAs FET 3 via contact C and contact D. C6 has a first end grounded, and has a second end connected to contact C. A first end of R6 is connected to contact D, and a second end of R6 is connected to first ends of both R7 and C8. The second ends of both R7 and C8 are grounded, respectively.

The source terminal of the final-stage GaAs FET 3 is grounded, and the external output lead 8 is connected to one end of C12 via contacts E and F. C9 and C10 are each grounded at a first end, whereas a second end of C9 is connected between $V_{DD2}$ and contact 3, and a second end of C10 is connected to contact E. C11 has a first end grounded and a second end connected to contact F. For purposes of this application, $V_{DD2}$ represents the voltage supplied to the gate terminal of the GaAs FET 3 and may have operational values within a range of 2.5 to 8.0 V, and typically 3.5V.

A second end of C12 is connected to the output terminal via points G and H, C13 grounded at one end is connected to contact G, and C14 grounded at one end is connected to contact H.

Briefly, the input stage comprises an impedance matching circuit and the FET 2. An FET bias circuit is formed by the configuration including the $V_{GG}$ input terminal, resistors R2–R4, and C3. The impedance matching circuit matches the impedance of the FET 2 (and more specifically the FET 2 input impedance $Z_{in}$ being matched to the complex conjugate of $Z_{in}$ (e.g., $Z=Z^*_{in}$), to set the proper bias for the FET 2. $V_G$ is set equal to $(R3+R4)/(R2+R3+R4)V_{GG}$ (e.g., $V_{GG}=-2.5V$). C3 is for filtering unwanted radio frequency (RF) signals from the outside.

The interstage circuit is formed by the FET devices 2 (which serves as a preamplifier) and 3 (which serves as the main amplifier) having same structure. An impedance matching circuit is formed by capacitors C4, C5, and C6, with $Z \simeq Z_1^*_{out} \simeq Z_2^*_{in}$. The FET bias circuit for FET 3 (including $V_{GG}$, R5–R7, and C8) has the same equation as above (e.g., $V_{G2}=(R6+R7)/(R5+R6+R7)V_{GG}$ (e.g., $V_{GG}=-2.5V$). Thus, maximum power is output from the second amplifier 3 with the FET 2 serving as a preamplifier.

In the output stage, a bias circuit is provided including $V_{DD2}$. C9 is for filtering unwanted RF signals from the outside. Impedance matching circuits ($Z=Z_2^*_{out}$) and a bandpass filter (e.g., formed for example by C13 and C14) are provided for filtering out unwanted frequencies. The bandpass filter eliminates unwanted high frequencies prior to output. Otherwise, oscillations would result. For example, the output stage eliminates the second harmonic and the like.

Thus, the voltage, with its power controlled and amplified, is supplied to the output terminal OUT. For example, if the output is low, $V_{DD1}$ would be increased and $V_{DD2}$ would be kept constant. As a result, the power would be controlled and the output would be amplified.

In the present invention, the first-stage GaAs FET 2 and the final-stage GaAs FET 3 in broken lines have the same device configuration and have the same transistor characteristics. By having the same transistor characteristics and structure, they do not interfere with each other, and hence no vibration, "noise", and the like are produced. As a result, this allows the transistors to be held in one package as a single module, thereby reducing the cost and allowing the package and the amplifier as a whole to be miniaturized.

In other words, an amplifier with a multistage configuration may be miniaturized by holding a plurality of FETs in one package, connecting the external input lead of the package to the input stage of the amplifier, connecting an interstage circuit between the intermediate output lead and the intermediate input lead of the package, and connecting the external output lead to the output stage of the amplifier. Here, the size may be further reduced by forming the input stage, the interstage circuit and the output stage on a module substrate, and incorporating the FET package onto the substrate.

FIGS. 6(A)–6(C) illustrate the completed structures of FIGS. 1(A)–1(C) after being hermetically sealed by being resin molded by an insulating resin 20. Specifically, the FET structures are covered with resin structure 20 to complete the package fabrication. Resin 20 may be an epoxy or thermosetting resin, for example.

FIG. 4 shows the frequency characteristics of isolation between the external input lead 5 and the external output lead 8 of embodiments of the high-frequency-oriented package illustrated in FIGS. 1(A)–1(C) and 5. FIG. 4 also shows the frequency characteristics of isolation between the external input lead 5 and the external output lead 8 of the second and third embodiments of the high-frequency-oriented package described further below and illustrated in FIGS. 2(A)–2(C) and 3(A)–3(C).

With high-frequency signals (0.5 GHz or higher), the electrical external I/O isolation must be −33 dB or greater, and thus allows use of low-output amplifiers (e.g., approximately 0.1 W or less). However, high-output amplifiers (1.5 W or more) are used in the transmitting stages (e.g., in the transmitter) of cellular phones, and the external I/O isolation must be −38 dB or lower. The external I/O isolation can be −40 dB or greater in the conventional systems.

Thus, with greater isolation, a negative feedback from the output lead to the input lead is produced, which results in a lower gain, even though system stability is increased Accordingly, the package is not suitable for use in high-output amplifiers in digital cellular phone systems which use a frequency band of around 1.5 GHz. Specifically, this is not suitable since the total output power of the amplifiers is decreased by the lower gain.

The isolation between the I/O leads is impaired (e.g., by about 10 dB) primarily due to the external input lead 5 and the external output lead 8 having relatively long portions (e.g., having a length on the order of 2 mm) being placed parallel to each other. Specifically, magnetic fields, which are produced when high-frequency signals with opposite directions of propagation pass through the transmission lines, tend to be coupled together. Thus, the isolation is impaired by the coupling together of the magnetic fields.

One method of maintaining isolation is to increase the distance between the I/O leads, thereby weakening the coupling of the magnetic fields. However, this method prevents downsizing of high-frequency-oriented packages.

Second Embodiment

A second embodiment of the present invention will now be explained in detail with reference to FIGS. 2(A)–2(C), which illustrates a lead frame for a plastic package and which allows miniaturization of high-frequency-oriented packages, and which is for overcoming the problems mentioned above and which is an improvement over the first embodiment.

The lead frame comprises an island portion 11 with a GaAs FET chip 10 mounted thereon which has two FETs including a first-stage FET and a final-stage FET on-board. A heat sink 13, formed of copper or the like, is provided on the underside of the island portion 11 for improving the heat-radiating performance of the lead frame.

A key aspect of the second embodiment is that the external input lead 5 and the external output lead 8 have minimized portions placed parallel to each other. Leads 5 and 8 each have a rectangular shape (in a plan view), with short side portions of each of leads 5 and 8 opposing one another. The width of the short side portions opposing one another is preferably in the range of 0.2–0.4 mm, and preferably the leads 5, 8 have a substantially identical shape, dimensions and configuration. It is noted that the leads 5, 8 may be substantially directly opposed to one another, or the leads can be skewed from one another (e.g., offset in which a lower corner of one the leads can be diagonally opposed to an upper corner of the other of the leads) so long as a distance of 1.5 mm or greater is kept between the two corners, as described below.

More specifically, the external input lead 5 is placed along one side of the outside shape of the high-frequency-oriented package, parallel to the side, and the external output lead 8 is placed along the same side, also parallel to the side. As a result of such a structure and positioning, a minimal magnetic field coupling area is produced around the I/O leads, thus preventing the impairment of the isolation due to the magnetic-field coupling.

The configuration illustrated in FIGS. 2(A)–2(C) allows high density packaging that results from the parallel leads and has many of the same features and characteristics of the first embodiment described above.

Additionally, in order to prevent coupling of magnetic fields around the bonding wires 9 connected to the external input lead 5 and the external output lead 8, a ground lead 12 is provided between the external input lead 5 and the external output lead 8.

Specifically, the ground lead 12 is provided between the opposed (or skewed, as mentioned above) short side portions of the external input lead 5 and the external output lead 8. Preferably, the ground lead 12 has a width of between 0.2–0.4 mm, and is separated from each of the short side portions of the leads 5, 8 by approximately 0.5 mm.

Since the ground lead 12 is electrically connected to the island portion 11, and the source terminals of the two FETs on the GaAs FET chip 10 are connected with the island portion 11 via the metallized layers on the side and the underside of the chip, the ground lead 12 itself is a source terminal. The GaAs FET chip 10 is mounted on and bonded to the lead frame shown in FIGS. 2(B) and 2(C), which is finally processed into a plastic package by transfer molding (as shown in FIGS. 7(A)–7(C).

Based on experimental results, the present inventor has found that the distance 14 between the external input lead 5 and the external output lead 8 must be 1.5 mm or more. The distance between the leads 6, 7 must not be 1.5 mm or greater. The 1.5 mm-or-greater separation distance must be met by the leads 5, 8. This separation distance will change with different-sized amplifiers. As mentioned above, the leads 5, 8 may be substantially directly opposed to one another, or the lead can be skewed from one another (e.g., a lower corner of one the leads can be diagonally opposed to an upper corner of the other of the leads), so long as the distance between the leads is no less than 1.5 mm.

Further, the heat-sink height 15 preferably should be 0.6 mm or less in order to secure the I/O isolation of −40 dB when high-frequency signals at 1.5 GHz or higher are amplified.

With the high-frequency-oriented package using the structure of the second embodiment of the present invention which is shown in FIGS. 2(A)–2(C), the frequency characteristics of the isolation between the external input lead 5 and the external output lead 8 are as shown in FIG. 4 at curve 2.

According to the second embodiment, an isolation on the order of —40 dB is ensured at frequencies of 1.5 GHz or higher. With high-output amplifiers having outputs of 1.5 W or greater, desired gains (e.g., 20 dB or more) may be achieved when the isolation between the I/O leads is –38 dB or more. Therefore, by using the second embodiment of the present invention, a high-frequency-oriented package may be formed for practical high-output amplifiers such as those for use in the transmitting stages of cellular telephones.

Here, the isolation frequency characteristics according to the second embodiment which is shown in FIGS. 2(A)–2(C) result when the heat-sink height 15 is 0.6 mm in height. The present inventor has confirmed that the isolation is increased by further reducing the heat-sink height 15 from 0.6 mm. For example, the heat-sink height can be advantageously reduced to 0.1 mm to increase the isolation even further.

The reason why the isolation increases is that the distance from the ground decreases as the heat-sink height 15 decreases. Thus, the magnetic lines of force produced by the bonding wires 9 tend to terminate at the ground, thereby lessening the chance of coupling of the magnetic fields when the heat-sink height (and thus distance to the ground) decreases.

FIGS. 7(A)–7(C) illustrate the completed structures of FIGS. 2(A)–2(C) after being hermetically sealed by being resin-molded by an insulating resin 21. Specifically, the FET structures are covered with resin structure 21 to complete the package fabrication. Resin 21, similarly to resin 20 mentioned above, may be an epoxy or thermosetting resin, for example.

Third Embodiment

A third embodiment of the present invention will now be described with reference to FIGS. 3(A)–3(C) which illustrate a structural view of a ceramic package. The third embodiment is an improvement over the second embodiment in, for example, its isolation characteristics.

Referring to FIGS. 3(A)–3(C), ceramic plates (Al$_2$O$_3$) 16 and 17 are mounted on a heat-radiating base 1, preferably formed of copper. Other candidate materials for the base include gold, silver, iron or the like.

Specifically and as better shown in FIGS. 3(B)–3(C), a lower-layer plate 17 is mounted on the base 1, followed by an upper-layer plate 16 being mounted on plate 17. Preferably, the plates 16, 17 are formed of the same (or similar) ceramic material. The center portions of the ceramic plates 16, 17 are hollowed-out and have mounted thereon a GaAs FET chip 10.

The GaAs FET chip 10 includes first and second FETs including a first-stage FET and a final-stage FET, with I/O leads 5–8 brazed (or attached by other similar methods such as mounting to the semiconductor chips) on the ceramic plate 16. The layout of the external input lead 5 and the external output lead 8 is the same as that according to the first embodiment of the present invention, and the external input lead 5 is placed along one side of the ceramic plate 16, substantially parallel to the side, with the external output lead 8 placed along the same side, also parallel to the side. Similarly to the second embodiment, the rectangular-shaped portions of the leads 5, 8 each have short side portions opposed to one another. Obviously, other shapes are possible besides an L-shape, so long as the small portions of the leads are opposed or skewed to one another and thus have minimal opposing end portion areas.

Further, a ground lead 12 is placed between the opposed short side portions of the external input lead 5 and the external output lead 8. The ground lead 12 is electrically connected to the copper base 1 via a gold-plated portion on the sidewall of a castellation 18 formed of a conducting metallic material and provided on the ceramic plates 16, 17. The ceramic plates form a two-layer structure including upper layer 16 and the lower layer 17. Preferably, the layers 16, 17 each have a same thickness and preferably the thickness is substantially 0.2 mm. The plates 16, 17 may have other thicknesses depending upon the designer's constraints and requirements, such as in the range of 0.1–0.3 mm.

Figure 8A:
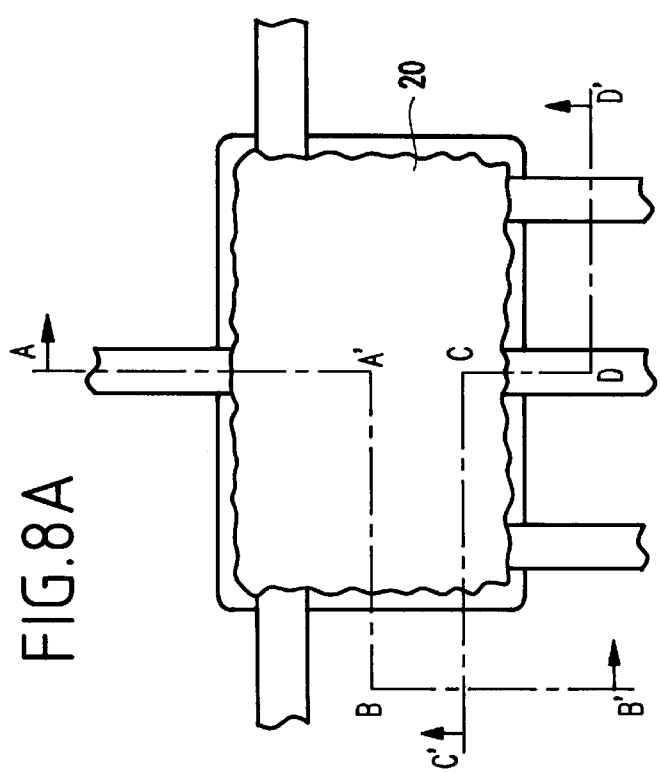
FIGS. 8(A)–8(C) are views illustrating the semiconductor device of FIGS. 3(A)–3(C), respectively, after resin molding.
Figure 8C:
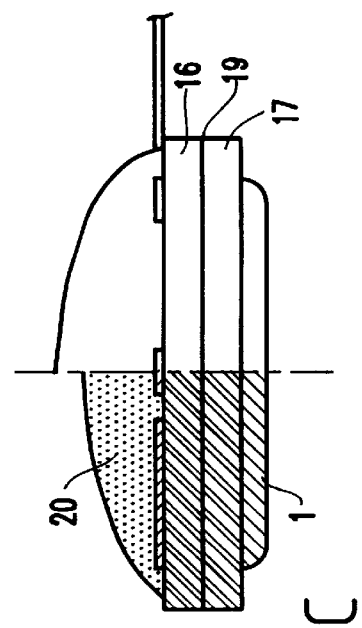
Figure 8B:
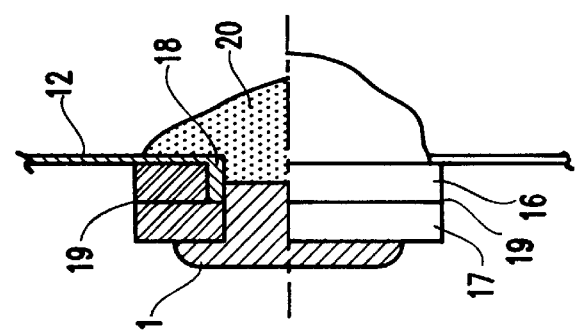
Figure 10:
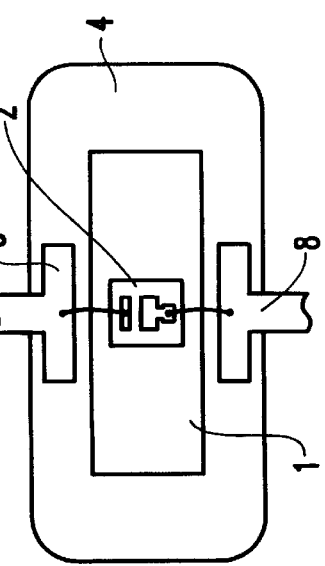
FIG. 10 is a plan view of a conventional semiconductor device.

A silver/copper brazing material 19 is applied over the entire area between the upper layer 16 and the lower layer 17 of the ceramic plates, with the silver/copper brazing material 19 being electrically connected to the copper base 1 through the gold-plated portion (as shown in FIGS. 3(B) and 8(B)) on a side of the castellation 18. Other brazing material which can be used instead of silver/copper includes gold, gold/silicon, gold/tin and the like.

FIGS. 8(A)–8(C) illustrate the completed structures of FIGS. 3(A)–3(C) after being hermetically seal by being resin-molded by an insulating resin 20. Specifically, the FET structures are covered with resin structure 20 to complete the package fabrication. Resin 20 may be an epoxy or thermosetting resin, for example.

According to the third embodiment, the castellation 18, the sidewall of which is electrically connected to the copper base 1, is in the grounded state. The surface of the silver/copper brazing material 19 provided between the ceramic plates 16 and 17, also being electrically connected to the copper base 1, functions as a ground surface.

With this configuration, more of the magnetic lines of force emitted from the bonding wires 9, the external input lead 5 and the external output lead 8 are terminated than those terminated according to the first and second embodiments of the present invention. Thus, since the coupling of the magnetic fields is more effectively prevented, the impairment of the isolation between the I/O leads is more effectively prevented than according to the first and second embodiments.

Referring to FIG. 4 again, the isolation frequency characteristics between the I/O leads of a high-frequency-oriented package according to the third embodiment are shown. An isolation of –50 dB is achieved at a frequency of 1.5 GHz. Thus, isolation is improved over that of the first and second embodiments.

Figures 9A, 9B:
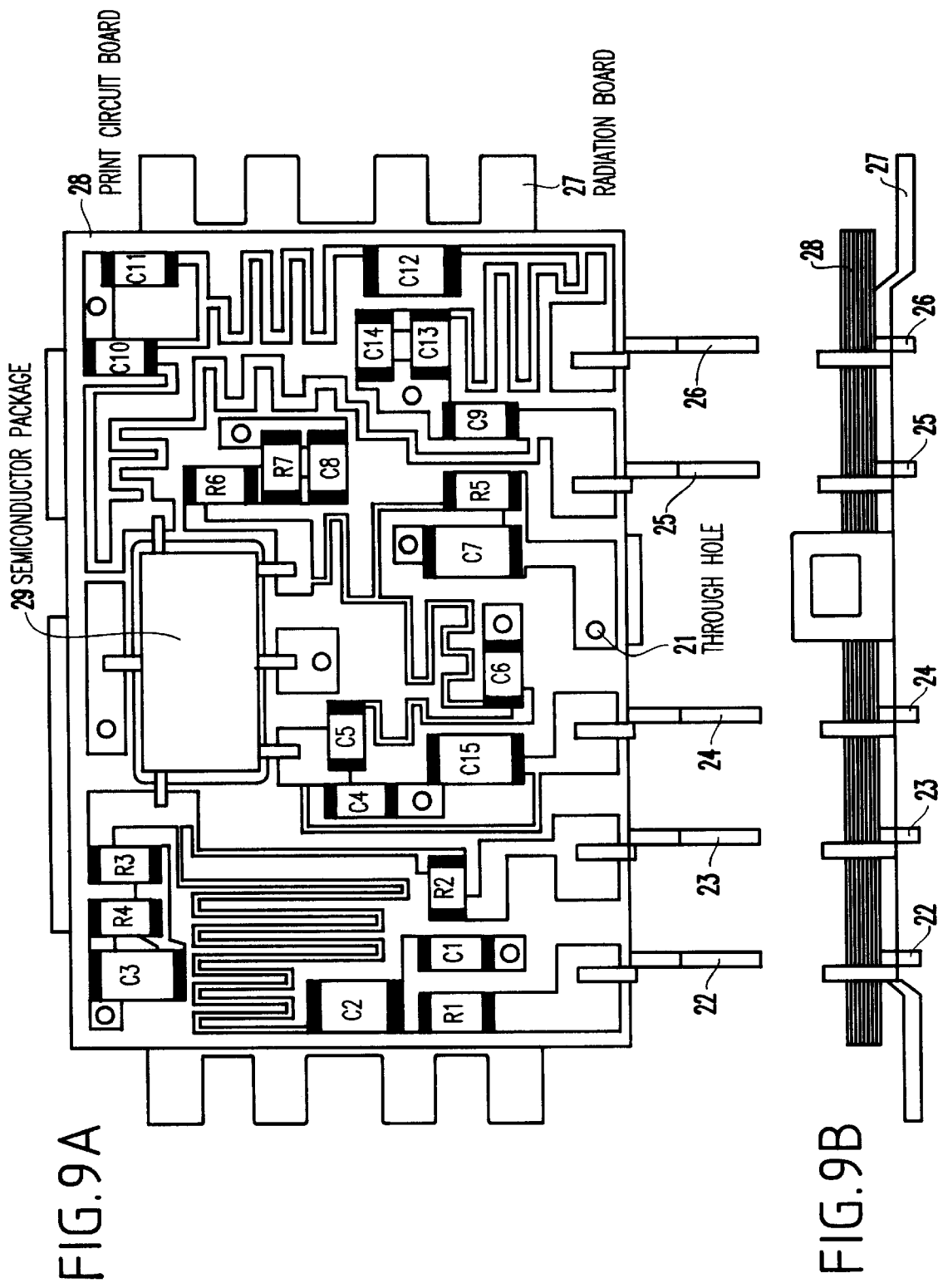
FIGS. 9(A) and 9(B) are a plan view and a cross-sectional view, respectively, of a layout of a high-amplifier module incorporating a semiconductor device according to the present invention.

FIG. 9(A) is a plan view and FIG. 9(B) is a cross-sectional side view illustrating high-output amplifier modules incorporating a semiconductor package 29 according to the invention. Specifically, terminals 22, 23 ($V_{GG}$), 24 ($V_{DD1}$), 25 ($V_{DD2}$) and 26 are provided as shown in FIG. 9(A) and configured with a radiation board 27. Printed circuit board 29 is provided incorporating semiconductor package 29. Through-holes 21 are provided as shown for connectivity of various elements.

With the unique and unobvious structures of the embodiments of the present invention, semiconductor packages and amplifiers result which are more compact, and which are less costly than the conventional packages and amplifiers.

Additionally, the layout of the leads prevents impairment of the I/O isolation due to the coupling of the magnetic fields. As a result, the gains of high-output amplifiers are maintained, since the layout of the leads is designed so that the external input lead and the external output lead have the least possible parallel portions (e.g., preferably only the short-side portions are opposed to one another). Further, a ground surface and a ground portion are provided so as to terminate the magnetic lines of force.

With the unique and unobvious structure and method of the invention, high-frequency-oriented semiconductor packages and amplifiers employing them can be miniaturized and made inexpensively as compared to the conventional packages and amplifiers.

Specifically, the miniaturization and cost reduction result by virtue of a plurality of FETs for use as a multistage high-frequency amplifier being designed to have the same device structure and being held in one semiconductor package. The external input lead 5 of the semiconductor package is connected to the input stage of the amplifier, an interstage circuit is connected between the intermediate output lead 6 and the intermediate input lead 7, and the external output lead 8 is connected to the output stage of the amplifier.

Thus, the invention provides a semiconductor module and package, and an amplifier having multiple GaAs FETs includes an interstage circuit to match impedance between the multiple GaAs FETs. The second embodiment includes non-parallel leads to increase isolation between the leads. The third embodiment includes ceramic plates separated by a brazing material to further increase isolation.

While the invention has been described in terms of several preferred embodiments, those skilled in the art will recognize that the invention can be practiced with modification within the spirit and scope of the appended claims.

Having thus described my invention, what I claim as new and desire to secure by Letters Patent is as follows:

1. A semiconductor device, comprising:
   an island portion having a quadrilateral shape defined by first and second parallel sides and third and fourth parallel sides;
   a semiconductor chip mounted on said island portion and having first and second terminals, said first and second terminals being arranged along said first side of said island portion;
   a first lead extending from an intermediate portion of said first side of said island portion in a direction perpendicular to said first side;
   a second lead arranged on one side of said first lead and elongated along said first side of said island portion apart from said island portion in a direction parallel to the first side, said second lead being electrically connected to said first terminal of said semiconductor chip; and
   a third lead arranged on the other side of said first lead and elongated along said first side of said island portion apart from island portion, said third lead being electrically connected to said second terminal of said semiconductor chip;
   said first lead being positioned between said second and third leads.

2. The semiconductor device as claimed in claim 1, wherein said semiconductor chip further includes third and fourth terminals, arranged along said second side of said island portion, said semiconductor device further comprising:
   a fourth lead extending from an intermediate portion of said second side of said island portion in a direction perpendicular to said second side;
   a fifth lead arranged on one side of said fourth lead and elongated along said second side of said island portion apart from said island portion, said fifth lead being electrically connected to said third terminal of said semiconductor chip; and
   a sixth lead arranged on the other side of said fourth lead and elongated along said second side of said island portion apart from island portion, said sixth lead being electrically connected to said fourth terminal of said semiconductor chip,
   said fourth lead being positioned between said fifth and sixth leads.

3. The semiconductor device as claimed in claim 2, further comprising a heat sink provided on a back surface of said island portion,
   said semiconductor chip being mounted on a front surface of said island portion,
   said first to sixth leads, said semiconductor chip, said island portion and said heat sink being integrally resin-molded.

4. The semiconductor device as claimed in claim 3, wherein said semiconductor chip includes first and second transistors each having first, second and third electrodes, the first and second electrodes of said first transistor being connected respectively to said first and third terminals, the first and second electrodes of said second transistor being connected respectively to said fourth and second terminals, the third electrodes of said first and second transistors being connected to said island portion.

5. A semiconductor device comprising:
   an island portion having first and second parallel sides;
   first and second leads arranged in line adjacent said first side of said island portion and extending along said first side of said island portion in opposite directions and in parallel to the first side;
   a third lead extending out of said first side of said island portion in a direction perpendicular to said first side, said third lead intervening between said first and second leads;
   fourth and fifth leads arranged in line adjacent said second side of said island portion and extending along said second side of said island portion in opposite directions;
   a sixth lead extending out of said second side of said island portion in a direction perpendicular to said second side, said sixth lead intervening between said fourth and fifth leads; and
   a semiconductor chip mounted on said island portion and having first, second, third and fourth terminals which are electrically connected to said first, second, fourth and fifth leads, respectively.

6. The semiconductor device as claimed in claim 5, wherein each of said fourth and fifth leads includes a bend in a direction perpendicular to said second side of said island portion, said bend forming a first portion parallel to said second side of said island portion and a second portion parallel to said sixth lead.

7. A semiconductor device comprising:
   a metal plate;
   an insulating plate provided on said metal plate and having an opening exposing a part of said metal plate, said opening having first and second parallel sides;
   a semiconductor chip mounted on said exposed part of said metal plate and having first, second, third and fourth terminals, said first and second terminals being arranged along said first side of said island portion, said third and fourth terminals being arranged along said second side of said island portion;

a first lead provided on said insulating plate, electrically connected to said metal plate and extending from an intermediate portion of said first side of said opening in a direction perpendicular to said first side;

a second lead provided on said insulating plate and arranged on one side of said first lead and elongated along said first side of said opening apart from said opening and in parallel to said first side, said second lead being electrically connected to said first terminal of said semiconductor chip;

a third lead provided on said insulating plate and arranged on the other side of said first lead and elongated along said first side of said opening apart from said opening, said third lead being electrically connected to said second terminal of said semiconductor chip, said first lead being positioned between said second and third leads;

a fourth lead provided on said insulating plate, electrically connected to said metal plate and extending from an intermediate portion of said second side of said opening in a direction perpendicular to said second side;

a fifth lead provided on said insulating plate and arranged on one side of said fourth lead and elongated along said second side of said opening apart from said opening, said fifth lead being electrically connected to said third terminal of said semiconductor chip; and a sixth lead provided on side insulating plate and arranged on the other side of said fourth lead and elongated along said second side of said opening apart from said opening, said sixth lead being electrically connected to said fourth terminal of said semiconductor chip, said fourth lead being positioned between said fifth and sixth leads.

8. The semiconductor package as claimed in claim 7, wherein each of said second and third leads projects outside of said insulating plate in a direction parallel to said first side, each of said fifth and sixth leads including a bend in a direction perpendicular to said second side of said opening, said bend forming a first portion parallel to said second side of said opening and a second portion parallel to said sixth lead, said second portion projecting outside of said insulating plate.

9. The semiconductor package as claimed in claim 8, wherein upper surfaces of said first to sixth leads, said semiconductor chip, said opening and said insulating plate are covered with resin.

* * * * *